United States Patent
Sato

(10) Patent No.: US 11,011,659 B2
(45) Date of Patent: May 18, 2021

(54) MOBILE BODY HAVING REFLECTION CONTROL LAYER

(71) Applicant: NISSAN MOTOR CO., LTD., Yokohama (JP)

(72) Inventor: Yuichi Sato, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 16/638,828

(22) PCT Filed: Aug. 14, 2017

(86) PCT No.: PCT/JP2017/029286
§ 371 (c)(1),
(2) Date: Feb. 13, 2020

(87) PCT Pub. No.: WO2019/035160
PCT Pub. Date: Feb. 21, 2019

(65) Prior Publication Data
US 2020/0194605 A1 Jun. 18, 2020

(51) Int. Cl.
*H01L 31/055* (2014.01)
*B60H 1/00* (2006.01)
*H01L 33/50* (2010.01)

(52) U.S. Cl.
CPC ....... *H01L 31/055* (2013.01); *B60H 1/00507* (2013.01); *H01L 33/502* (2013.01); *H01L 33/505* (2013.01)

(58) Field of Classification Search
CPC ... H01L 31/055; H01L 33/502; H01L 33/505; B60H 1/00507

USPC ........................................................ 257/431
See application file for complete search history.

(56) References Cited

U.S. PATENT DOCUMENTS

| 4,705,952 A * | 11/1987 | Lindmayer | C09K 11/7786 250/483.1 |
| 2002/0188051 A1 | 12/2002 | Hugo | |
| 2004/0257330 A1* | 12/2004 | Minami | C08F 292/00 345/107 |
| 2008/0057096 A1* | 3/2008 | Ibsen | A61K 31/60 424/423 |
| 2008/0265208 A1* | 10/2008 | Mitsunaga | G01N 33/582 252/301.4 P |
| 2012/0064134 A1* | 3/2012 | Bourke, Jr. | A61K 8/23 424/401 |

FOREIGN PATENT DOCUMENTS

| JP | 2005-112108 A | 4/2005 |
| JP | 2015-127129 A | 7/2015 |
| WO | WO 2015/046004 A1 | 4/2015 |

OTHER PUBLICATIONS

English Machine Translation of JP Patent No. JP 2005/112108 (Year: 2005).*
English Machine Translation of WO 2015/046004 (Year: 2015).*

* cited by examiner

*Primary Examiner* — Dzung Tran
(74) *Attorney, Agent, or Firm* — Foley & Lardner LLP

(57) ABSTRACT

A mobile body=includes a reflection control layer that is formed on a surface of the mobile body, to absorb light in a wavelength region from 0.3 micrometer to 0.75 micrometer of incident sunlight, and emit light in a wavelength region from 0.75 micrometer to 100 micrometers.

10 Claims, 6 Drawing Sheets

MOBILE BODY HAVING REFLECTION CONTROL LAYER

TECHNICAL FIELD

The present invention relates to a mobile body having a reflection control layer formed on a surface thereof.

BACKGROUND ART

Conventionally, in order to detect DNA by an infrared fluorescent probe, it has been known to use titanium oxide as an infrared fluorescent substance (see Patent Literature 1). Patent Literature 1 describes that the infrared fluorescence indicates a characteristic of emitting infrared rays at the time of absorbing light in an ultraviolet visible region, titanium oxide is excited with light in a wavelength region from 0.3 micrometer to 0.4 micrometer inclusive, and fluorescence emitted by light in a wavelength region from 0.7 micrometer to 1.2 micrometers inclusive is used.

CITATION LIST

Patent Literature

Patent Literature 1: International Publication No. WO2015/046004

SUMMARY OF INVENTION

Technical Problem

Meanwhile, the inventors of the present invention have found that it is effective to increase the temperature in a region (a mainstream) outside a region where an air flow velocity near a mobile body decreases (a boundary layer), in order to reduce the air resistance of the mobile body. Based on this finding, the inventors of the present invention have recognized a problem to increase the reflection intensity of light in an absorption band of a substance that absorbs sunlight in the atmosphere (a sunlight absorbing substance), of the reflection intensity of sunlight on a surface of the mobile body, in order to increase the temperature of the mainstream.

However, the absorption band of the sunlight absorbing substance is equal to or longer than 0.75 micrometer, the titanium oxide in Patent Literature 1 cannot be effectively used as a reflection control layer that increases the reflection intensity of light in the absorption band of the sunlight absorbing substance.

The present invention has been made in view of such problems, and an object of the present invention is to reduce the air resistance of a mobile body by increasing the air temperature of a mainstream around the mobile body.

Solution to Problem

A mobile body according to an aspect of the present invention includes a reflection control layer that is formed on a surface of the mobile body, to absorb light in a wavelength region from 0.3 micrometer to 0.75 micrometer of incident sunlight, and emit light in a wavelength region from 0.75 micrometer to 100 micrometers.

Advantageous Effects of Invention

According to an aspect of the present invention, it is possible to reduce the air resistance of a mobile body by increasing the air temperature of a mainstream around the mobile body.

DESCRIPTION OF EMBODIMENTS

Embodiments of the present invention will be described below with reference to the drawings. In the descriptions of the drawings, like parts are denoted by like reference signs and redundant explanations thereof will be omitted. In the following descriptions, a case where a mobile body is an automobile is described as an example.

First Embodiment

Figure 6:
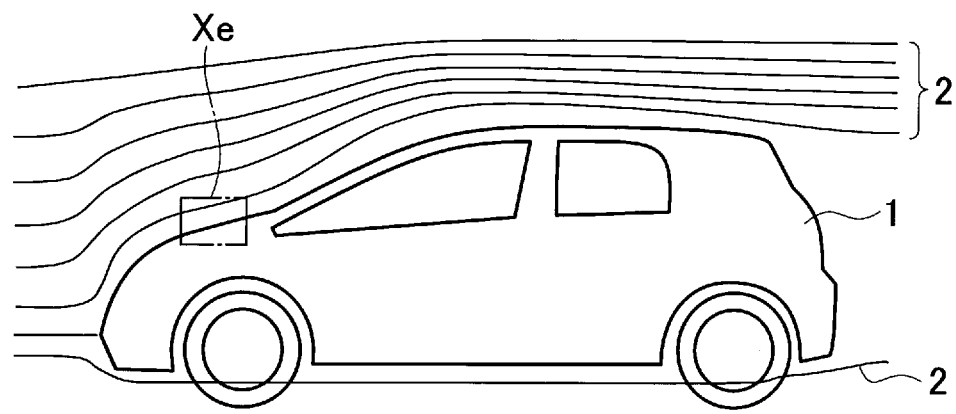
FIG. 6 is a schematic diagram of an air flow generated around the automobile 1.
Figure 7:
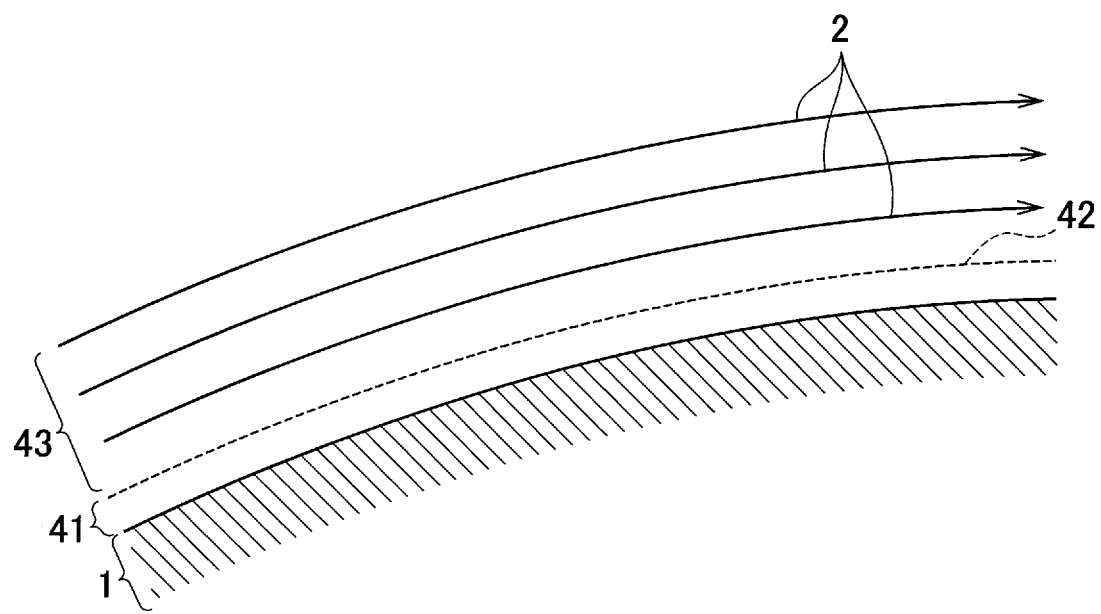
FIG. 7 is an enlarged sectional view of a region Xe in FIG. 6.

FIG. 6 illustrates an air flow generated during travel of an automobile 1 according to the present embodiment. FIG. 7 is an enlarged sectional view along a traveling direction of the automobile 1 near a surface of the automobile 1 according to the present embodiment.

Figure 1:
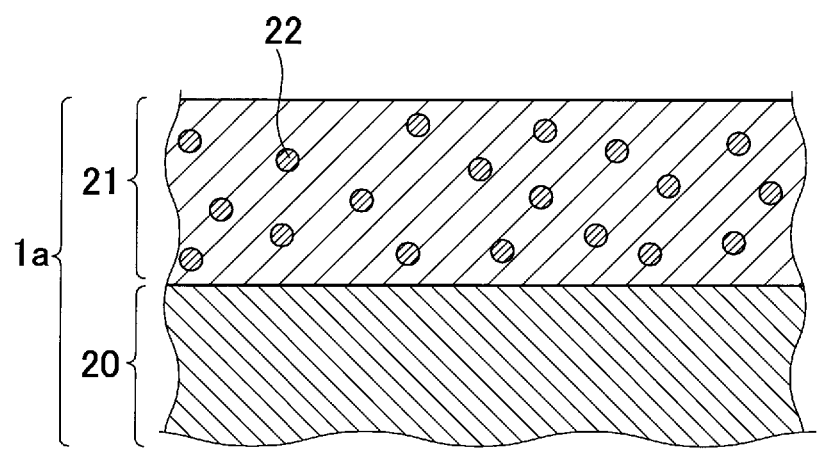
FIG. 1 is an enlarged sectional view illustrating a surface structure of an automobile 1 according to a first embodiment.

As illustrated in FIG. 1, a vehicle-body paint layer 20 is formed on the surface of the automobile 1, and a reflection control layer 21 is further formed on the vehicle-body paint layer 20.

The reflection control layer 21 absorbs light of a wavelength from 0.3 micrometer inclusive to less than 0.75 micrometer, of light in a wavelength region of sunlight (0.3 micrometer to 100 micrometers), and emits light of a wavelength from 0.75 micrometer to 100 micrometers inclusive. The wavelength region of the sunlight reaching the ground consists of a wavelength region of near ultraviolet radiation (0.3 micrometer to 0.38 micrometer), a visible light region (0.38 micrometer to 0.75 micrometer), and a wavelength region of infrared radiation (0.75 micrometer to 100 micrometers). Further, the wavelength region of the infrared radiation consists of a wavelength region of near infrared rays (0.75 micrometer to 3 micrometers), and a wavelength region of middle-infrared and far-infrared rays (3 micrometers to 100 micrometers). Therefore, the reflection control layer 21 has characteristics of converting light in the wavelength region of near ultraviolet radiation (0.3 micrometer to 0.38 micrometer) and the visible light region (0.38 micrometer to 0.75 micrometer) that are incident to the surface of the automobile 1 to light in the wavelength region of infrared radiation (0.75 micrometer to 100 micrometers) and reflecting the light. Due to the characteristic, the reflection intensity of light in the wavelength region from 0.75 micrometer to 100 micrometers on the surface of the automobile 1 can be increased.

<Air Flow Around Automobile 1 During Travel>

As illustrated in FIG. 6, when it is viewed in a static system of the automobile 1, an air flow along the surface of the automobile 1 is generated around the automobile 1 during travel. As illustrated in FIG. 7, the air flow becomes slow due to the viscous friction generated between the air and the surface of the automobile 1 near the surface of the automobile 1, to form a boundary layer 41. In the boundary layer 41, as moving away from the surface of the automobile 1, the velocity of air increases, and the velocity of air approaches the relative velocity of the automobile 1 with respect to the air.

In an outside region 43 outside a boundary 42, being away from the surface of the automobile 1, there is no influence of the viscous friction generated between the air and the surface of the automobile 1 and the velocity of air becomes substantially equal to the relative velocity of the automobile 1 with respect to the air. The air flow in the outside region 43 is referred to as "mainstream 2".

<Mechanism for Reducing Air Resistance>

Next, a mechanism for reducing the air resistance of the automobile 1 by providing the reflection control layer 21 that reflects light in a wavelength region from 0.3 micrometer to 0.75 micrometer to the automobile 1 is described.

In general, the force received from the air by the automobile 1 during travel is represented by the force in each axial direction of the front and rear, right and left, and up and down directions of the automobile 1 and a moment around each axis, and is collectively referred to as "six components of aerodynamic force". Normally, the force received from the air by the automobile 1 during travel is represented non-dimensionally. Particularly, an air resistance F being the force in the front and rear direction is represented by an air resistance coefficient $C_d$ represented by the following formula 1. Here, $\rho$ is a density of the air in the outside region 43, A is a frontal projected area with respect to the traveling direction of the automobile 1, and V is a relative velocity of the automobile 1 with respect to the mainstream.

$$C_d = \frac{2F}{\rho V^2 A} \quad \text{[Formula 1]}$$

The air resistance coefficient $C_d$ is a value obtained by dividing the air resistance F by a product of a dynamic pressure of air "$\rho V^2/2$" and the frontal projected area A. The air resistance coefficient $C_d$ is an amount determined depending on the shape of the automobile 1, and affects the fuel consumption at the time of travel, the maximum velocity, the acceleration performance, and the like. In the air resistance F of an object such as the automobile 1, pressure resistance is dominant when it is considered in the automobile 1 as a whole, and friction resistance, which becomes a problem in an aircraft, is small in the automobile 1. Therefore, in order to reduce the air resistance F in the automobile 1, it is effective to focus on a reduction of the pressure resistance.

When reviewing the formula 1 based on the above focusing, in the design of a normal automobile, the frontal projected area A is regarded as an available parameter in the design of a vehicle in order to reduce the pressure resistance. Meanwhile, the air density $\rho$ of the mainstream and the velocity V can vary according to the travel environment of the automobile, and thus the air density $\rho$ and the velocity V are not regarded as an available parameter in the design of a vehicle.

However, the inventors of the present invention consider that the air density $\rho$ of the mainstream can be an available parameter in the design of a vehicle in order to reduce the pressure resistance, without being bound by the framework of existing concepts described above. Then, the present inventors have found that the air density p of the mainstream 2 is reduced by heating the air in the mainstream 2, and as a result, the air resistance F can be reduced, focusing on that the pressure resistance occupying the major part of the air resistance F is proportional to the air density $\rho$ of the mainstream.

Since the air in the mainstream 2 is present at a place away from the surface of the automobile 1, the air cannot be heated directly. However, by providing the reflection control layer 21 that reflects light in a predetermined wavelength region on the surface of the automobile 1, light irradiated from the sun, clouds, and moisture in the air, and light such as infrared rays radiated from the road surface are reflected by the reflection control layer 21, and the air in the mainstream 2 can be heated by the reflected light.

From the reasons described above, since the automobile 1 has the reflection control layer, air resistance of the automobile 1 can be reduced.

<Temperature increase of mainstream 2 by reflected light>

In order to verify that the air in the mainstream 2 can be actually heated by the mechanism described above, the present inventors arranged a fender of the automobile 1 in a wind tunnel and irradiated simulated sunlight to the fender portion in an air flowing state, in order to simulate the travel environment of the automobile 1. Then, the present inventors measured how much the temperature increased before and after the air flowing in the portion irradiated with the simulated sunlight passed the portion. Three types of fenders having the same shape but with a different paint from each other were prepared to perform verification. A paint layer formed on the fender corresponds to the reflection control layer 21 in the present embodiment.

Figure 5:
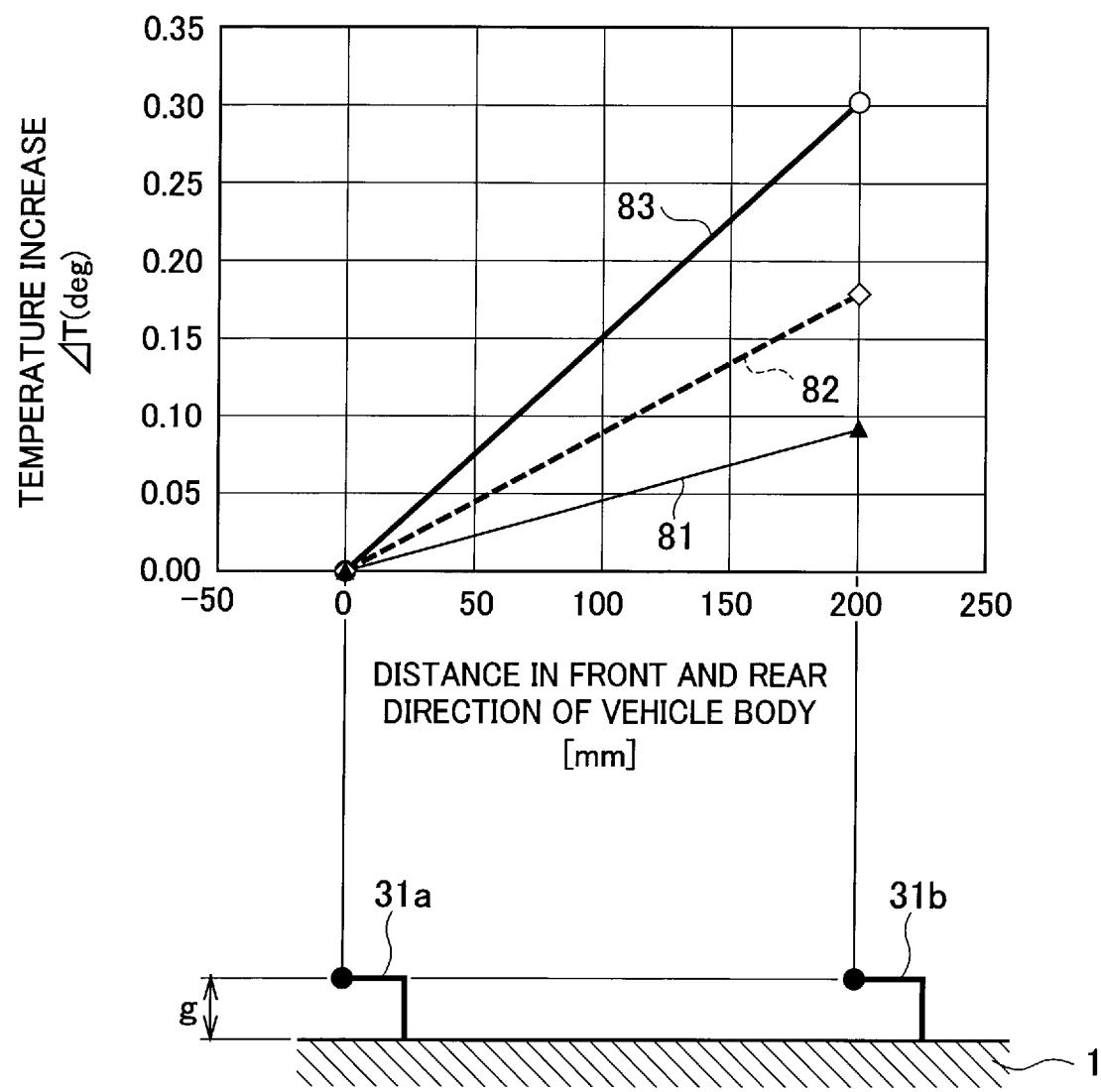
FIG. 5 is a graph illustrating a verification result of the temperature increase of a mainstream 2 by reflected light.

FIG. 5 is a graph illustrating a verification result of the temperature increase of the mainstream 2 by the reflected light. FIG. 5 illustrates evaluation results according to first to third experimental examples in which the verification was performed, where reference sign 81 corresponds to the first experimental example in which standard black paint referred to as "super black" is applied, reference sign 82 corresponds to the second experimental example in which standard white paint referred to as "white pearl" is applied, and reference sign 83 corresponds to the third experimental example in which silver paint by "silver plating" is applied. The average reflectance in a wavelength region from an ultraviolet wavelength to a far infrared wavelength increases in the order of the first to third experimental examples.

Here, the "average reflectance" is a mean value of a spectral reflectance (a reflectance with respect to monochromatic light) in a specified wavelength region. That is, in the specified wavelength region, the spectral reflectance being a wavelength function is measured, and a value acquired by averaging the spectral reflectance measured over the specified wavelength region is defined as "average reflectance".

In the verification, a thermocouple 31a is arranged on an upstream side of a portion irradiated with the simulated sunlight and a thermocouple 31b is arranged on a downstream side of the portion irradiated with the simulated sunlight, along the flow of the air at positions away from the fender surface (an example of the surface of the vehicle body 1a) of the automobile 1 by a distance g in a vertical direction to the surface. Here, the distance g is set to 18 millimeters so that the thermocouples are arranged in the mainstream outside the boundary layer on the surface of the fender. The thermocouple 31a and the thermocouple 31b are arranged with a gap of 200 millimeters along the flow of the air, and the simulated sunlight is irradiated to a section sandwiched between the thermocouple 31a and the thermocouple 31b. The velocity of the air in the mainstream 2 with respect to the fender is set to a wind velocity of 40 kilometers per hour.

For the sake of accuracy of verification, enough attention is paid so that the simulated sunlight is not directly irradiated with respect to the thermocouple 31a and the thermocouple 31b. The air temperature measured by the thermocouple 31a is the temperature of the air immediately before being warmed by the simulated sunlight reflected by the fender, and the air temperature measured by the thermocouple 31b is the temperature of the air immediately after being warmed by the simulated sunlight reflected by the fender.

As illustrated in FIG. 5, it has been found that the temperature measured by the thermocouple 31b is higher than the temperature measured by the thermocouple 31a. Further, it has been found that a temperature increase $\Delta T$ increases in the order of the first to third experimental examples. That is, it has been found that the temperature increase $\Delta T$ becomes larger, as the average reflectance of the paint on the surface of the automobile 1 becomes higher.

When it is assumed that the whole length of an actual automobile 1 is 4400 millimeters, the temperature increase over the whole length of the automobile 1 becomes 22 times the temperature increase $\Delta T$ illustrated in FIG. 5. Therefore, in the actual automobile 1, temperature increases of about 2K, about 4K, and about 6.6K occur in the order of the first to third experimental examples.

As described above, it has been found that the air in the mainstream 2 can be actually heated by reflecting light by the reflection control layer 21 provided on the surface of the automobile 1.

When this is applied to an equation of state for an ideal gas, if it is assumed that the air of 300K becomes 306.6K by a temperature increase of 6.6K, a density reduction of about 2% is caused. This corresponds to a reduction of about 2% in the air resistance F.

<Absorbing Wavelength Region of Sunlight Absorbing Substance>

The reflection intensity on the surface of the automobile 1 changes in accordance with the wavelength region of light. It is desired to increase the reflection intensity of light in a wavelength region that is absorbed by a substance that absorbs sunlight present in the air (a sunlight absorbing substance), in order to heat the air in the mainstream 2. The sunlight absorbing substance is mainly oxygen ($O_2$, $O_3$), moisture ($H_2O$), carbon dioxide (CO2), and noble gas. The substance having the shortest absorption wavelength among the sunlight absorbing substances is oxygen ($O_2$), and oxygen ($O_2$) mainly absorbs light of a wavelength of about 0.75 micrometer or longer. A wavelength region from 0.75 micrometer to 0.78 micrometer, of the wavelength region of the near infrared rays, is a heat absorption band (an oxygen A-band) of oxygen molecules in the atmosphere. The sunlight absorbing substances absorb light in the wavelength region from 0.75 micrometer to 100 micrometers. An upper limit of the wavelength of the sunlight absorbing substance is set to 100 micrometers in order to absorb light in the infrared radiation range (3 to 100 micrometers) from clouds and moisture.

Therefore, the reflection control layer 21 absorbs light in a wavelength region (0.3 micrometer to 0.75 micrometer) that is not absorbed by the sunlight absorbing substance. The reflection control layer 21 converts absorbed energy to light in a wavelength region (from 0.75 micrometer to 100 micrometers inclusive) that is absorbed by the sunlight absorbing substance and emits the light. Accordingly, since the reflection intensity of light in the wavelength region absorbed by the sunlight absorbing substance, of the reflection intensity of light on the surface of the automobile 1, is increased, the air in the mainstream 2 can be heated.

<Configuration of Reflection Control Layer 21>

In order to improve the reflectance of light having a wavelength from 0.75 micrometer to 100 micrometers inclusive on the surface of an automobile, the automobile 1 has the reflection control layer 21 formed on the vehicle-body paint layer 20, as illustrated in FIG. 1. The reflection control layer 21 absorbs light in a wavelength region from 0.3 micrometer to 0.75 micrometer, of incident sunlight, and emits light in a wavelength region from 0.75 micrometer to 100 micrometers. A specific mode is described below.

As illustrated in FIG. 1, the reflection control layer 21 has a wavelength control substance 22. The wavelength control substance 22 in the present embodiment is a plurality of granular bodies immersed in a clear layer having a high degree of transparency with respect to the sunlight. For example, the wavelength control substance 22 is formed of a fluorescent substance. The "fluorescence" means fluorescence in a narrow sense, and is a luminescent phenomenon such that energy of incident light is absorbed to become an excited state (an initial state) in which outer-shell electrons are excited, and when the excited electrons transit to a ground state (a final state), an electromagnetic wave (light) is emitted. Spin multiplicity in the initial state is the same as that in the final state and thus it is a luminescent phenomenon having a short emission lifetime.

Alternatively, the wavelength control substance 22 may be a phosphorescent substance (including a luminous substance). The "phosphorescence (including luminescence)" is a luminescent phenomenon same as fluorescence. However, since the phosphorescent phenomenon uses forbidden transition in which the spin multiplicity in the initial state and that in the final state are different, the emission lifetime is longer than that of the fluorescence.

Figure 2A:
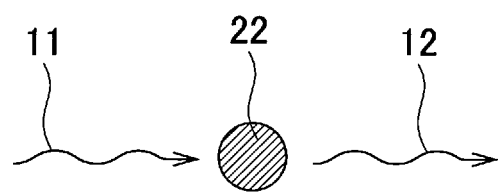
FIG. 2A is a schematic diagram for explaining fluorescence of a wavelength control substance 22.
Figure 2B:
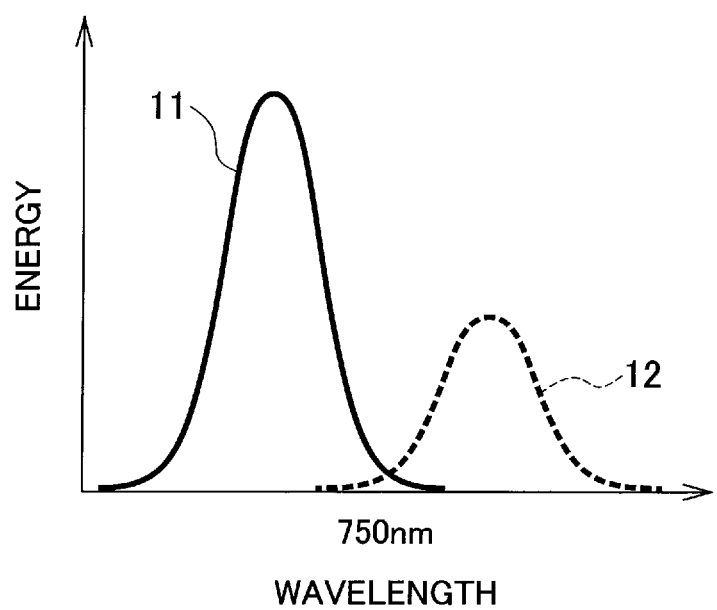
FIG. 2B is a schematic diagram for explaining an excitation wavelength region and a fluorescence wavelength region of the wavelength control substance 22.

As illustrated in FIG. 2A and FIG. 2B, the wavelength control substance 22 absorbs a light 11 in a wavelength region from 0.3 micrometer to 0.75 micrometer of the incident sunlight, and emits a light 12 in a wavelength region from 0.75 micrometer to 100 micrometers. Examples of the fluorescent substance and the phosphorescent (luminescence) substance that absorb light in the wavelength region from 0.3 micrometer to 0.75 micrometer and emit light in the wavelength region from 0.75 micrometer to 100 micrometers are as illustrated in Table 1 and Table 2.

TABLE 1

Fluorescent substance

| Type (Reference) | Compound | Nominal designation |
|---|---|---|
| For CRT | (ZnCd)S:Ag, Cu | silver copper-activated zinc sulfide, cadmium phosphor |
| | ZnS:Ag, Al | copper silver aluminum-activated zinc sulfide phosphor |
| | Y2O2S:Eu | europium-activated yttrium sulfide phosphor |
| For fluorescent light | (SrCaBaMg)5(PO4)3Cl:Eu | europium-activated strontium barium calcium phosphate phosphor |
| | LaPO4:Ce, Tb | cerium terbium-activated lanthanum phosphate phosphor |
| | Y2O3:Eu | trivalent europium-activated yttrium oxide phosphor |
| | Ca10(PO4)6FCl: Sb, Mn | calcium halophosphate phosphor |
| For POP (plasma display) | BaMgAl$_{10}$O$_{17}$:Eu, Mn | europium manganese-activated barium magnesium aluminum phosphor |
| | ZnSiO4:Mn | manganese-activated zinc silicate phosphor |
| | Y3Al5O12:Ce | Cerium-activated garnet phosphor |
| | (Y, Gd)BO3:Eu, Tb | europium terbium-activated yttrium borate gadolinium phosphor |
| For X-rays | CaWO4 | calcium tungstate phosphor |
| | Gd2O2S:Tb | terbium-activated gadolinium oxysulfide |
| | (Y, Sr)TaO4:Nb | niobium-activated yttrium tantalite strontium phosphor |
| Others | Cd2B2O5:Mn | manganese-activated cadmium borate phosphor |
| | YVO3:Eu | europium-activated yttrium vanadate phosphor |
| | ZnS:Bi | bismuth-activated zinc sulfide |
| | CaF2 | calcium fluoride (fluorite) |
| Fluorescent pigment | C26H32N3NaO7S | merocyanine |
| | C20H12 | perylene |
| | C13H9N | acridine |
| | C22H27N7O | luciferin |
| | Cl6H7Na3O10S3 | pyranine |
| | C14H12 | stilbene |
| | C28H31O3N2Cl | rhodamine |
| | C9H6O2 | coumalin |
| | C21H11NO5S | fluorescein |
| | C9H6O3 | umbelliferone |

TABLE 2

Phosphorescent (luminescent) substance

| Type (reference) | Compound | Nominal designation |
|---|---|---|
| Metallic complex | iridium (Ir) metal complex platinum (Pt) metal complex rhenium (Re) metal complex ruthenium (Ru) metal complex osmium (Os) metal complex thulium (Tm) metal complex copper (Cu) metal complex silver (Ag) metal complex, zinc (Zn) metal complex gold (Au) metal complex | |
| Luminous pigment | MoA12O3:Eu | europium-activated alumina molybdenum oxide luminous phosphor |
| | ZnS:Cu, Cl | copper chlorine-activated zinc sulfide luminous phosphor |
| | Sr4Al14O25:Eu, Dy | luminous phosphor dysprosium, europium-activated strontium aluminate luminous phosphor |

<Thickness of Reflection Control Layer 21>

According to the present embodiment, the thickness of the reflection control layer 21 provided on the surface of the automobile 1 is adjusted in order to improve the reflectance of light in the wavelength region absorbed by the sunlight absorbing substance. This mode is described next.

[Reflection Accompanying Interference in Thin Film]

Figure 8:
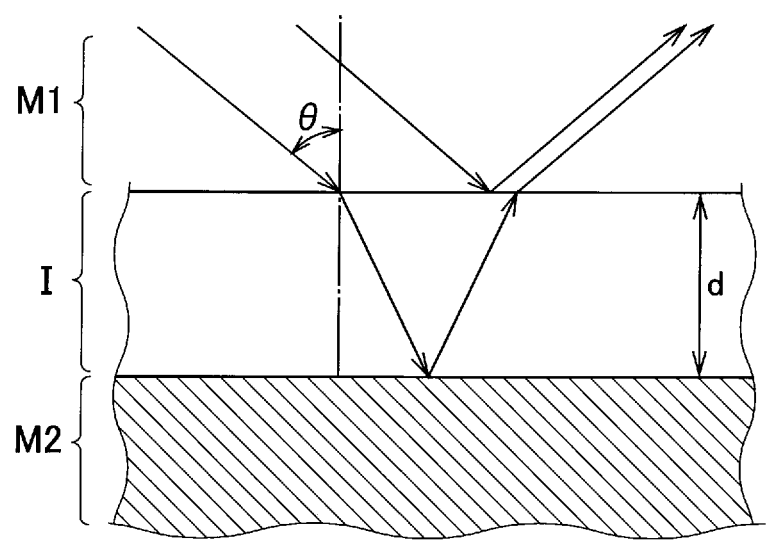
FIG. 8 is a diagram illustrating a state of refraction of light in a thin film sandwiched between substances having a different refractive index.

FIG. 8 is a diagram illustrating a state of refraction of light in a thin film sandwiched between substances having a different refractive index.

FIG. 8 illustrates a state in which a thin film I having a thickness d and a refractive index n is formed on a medium M2 having a refractive index $n_m$, and a medium M1 having a refractive index $n_0$ is present on the thin film I. It is assumed that light having a wavelength λ is incident to the thin film I from the side of the medium M1 at an incident angle θ. Consideration of such a state is a good model to examine the state of an interference of light generated among the vehicle-body paint layer 20, the reflection control layer 21, and the air stacked on the surface of the automobile 1.

An optical path difference L (a difference in optical distance) generated between light reflected by a boundary between the medium M1 and the thin film I and light reflected by a boundary between the thin film I and the medium M2 is represented by the following formula 2.

$$L = 2d\sqrt{n^2 - n_0^2 (\sin\theta)^2} \quad \text{[Formula 2]}$$

Next, an intensity reflectance R when light incident to the thin film I from the side of the medium M1 is multiply-reflected by the thin film I, and then reflected to return to the medium M1 is calculated.

An amplitude reflectance at the boundary when the light travels from the medium M1 to the thin film I is referred to as $r_1$, and an amplitude reflectance at the boundary when the light travels from the thin film I to the medium M2 is referred to as $r_2$. Further, when an amplitude of light incident to the thin film I from the side of the medium M1 is referred to as $A_0$, and an amplitude of light returning by being reflected by the thin film I is referred to as $A_R$, it has been known that a relation of the following formula 3 is established. Here, a case of vertical incidence (a case where an incident angle θ is 0 degree) is assumed.

$$A_R = \frac{A_0(r_1 + r_2 e^{2i\delta})}{1 + r_1 r_2 e^{2i\delta}} \quad \text{[Formula 3]}$$

Here, a parameter $\delta$ is represented by the following formula 4.

$$\delta = \frac{2\pi}{\lambda} nd \quad \text{[Formula 4]}$$

Therefore, the intensity reflectance R is represented by the following formula 5.

$$R = \frac{|A_R|^2}{|A_0|^2} = \frac{r_1^2 + r_2^2 + 2r_1 r_2 \cos(2\delta)}{1 + (r_1 r_2)^2 + 2r_1 r_2 \cos(2\delta)} \quad \text{[Formula 5]}$$

The amplitude reflectance $r_1$ and the amplitude reflectance $r_2$ are represented by the following formula 6 and formula 7.

$$r_1 = \frac{n_0 - n}{n_0 + n} \quad \text{[Formula 6]}$$

$$r_2 = \frac{n - n_m}{n + n_m} \quad \text{[Formula 7]}$$

In order to delete $r_1$ and $r_2$ from the formula 5, the formula 6 and the formula 7 are substituted in the formula 5 to be arranged, and then the intensity reflectance R is represented by the following formula 8.

$$R = 1 - \frac{8 n_0 n^2 n_m}{(n_0^2 + n^2)(n^2 + n_m^2) + 4 n_0 n^2 n_m + (n_0^2 - n^2)(n^2 - n_m^2)\cos(2\delta)} \quad \text{[Formula 8]}$$

The intensity reflectance R becomes 0 if the following two conditions are satisfied. A first condition is referred to as "amplitude condition", in which the amplitude reflectance $r_1$ and the amplitude reflectance $r_2$ become equal to each other. At this time, the refractive index n is represented by the following formula 9 by using the refractive index $n_0$ and the refractive index $n_m$.

$$n = \sqrt{n_0 n_m} \quad \text{[Formula 9]}$$

A second condition is referred to as "phase condition" and represented by the formula 10. Note that m is an integer equal to or larger than 0.

$$2\delta = (2m+1)\pi \quad \text{[Formula 10]}$$

The first condition is a condition in which amplitudes of the light reflected by the boundary between the medium M1 and the thin film I and the light reflected by the boundary between the thin film I and the medium M2 match with each other. Further, the second condition is a condition in which a phase difference between the light reflected by the boundary between the medium M1 and the thin film I and the light reflected by the boundary between the thin film I and the medium M2 is an odd multiple of the half wavelength of incident light, and a peak and a trough of the wave just cancel each other.

By deleting the parameter $\delta$ from the formula 4 and the formula 10 and arranging the formulae, the following formula 11 regarding the thickness d is acquired.

$$d = \frac{2m+1}{4n} \lambda \quad \text{[Formula 11]}$$

In the state illustrated in FIG. 8, a case where monochromatic light enters is assumed. However, in the actual design of the thin film such as the reflection control layer 21, it is necessary to examine a response of the thin film with respect to light in which elements of light of multiple wavelengths are mixed. The intensity reflectance R derived above can be regarded as the spectral reflectance with respect to the light of the wavelength $\lambda$. Therefore, a case where the average reflectance increases and a case where the average reflectance decreases are examined based on the behavior of the intensity reflectance R.

Generally, the wavelength $\lambda$ can take an arbitrary value in a predetermined wavelength region at the time of defining the average reflectance. Therefore, a term "$\cos(2\delta)$" appearing in a denominator of the second term on the right hand side in the formula 8 can take a value from −1 to 1.

When it is assumed that "$\cos(2\delta)=1$" is established, the intensity reflectance R is represented as $R_1$ of the following formula 12.

$$R_1 = 1 - \frac{4 n_0 n_m}{(n_0 + n_m)^2} \quad \text{[Formula 12]}$$

$R_1$ is equal to the intensity reflectance in the boundary between the medium M1 and the medium M2 in the case where the thin film I is not present in FIG. 8 and the medium M1 and the medium M2 directly come in contact with each other. This can be understood from the fact that "$\cos(2\delta)=1$" includes a case where the thickness d of the thin film I is 0, in relation to the formula 4.

On the other hand, when it is assumed that "$\cos(2\delta)=-1$" is established, the intensity reflectance R is represented as $R_2$ of the following formula 13.

$$R_2 = 1 - \frac{4 n_0 n_m}{\left(n + \frac{n_0 n_m}{n}\right)^2} \quad \text{[Formula 13]}$$

The intensity reflectance R is a function that oscillates between $R_1$ and $R_2$ described above according to the wavelength $\lambda$.

When focusing on the fact that $R_1$ is a constant that does not depend on the refractive index n, in order to increase the average reflectance in the state illustrated in FIG. 8 as compared with a case where the thin film I is not provided, it suffices that "$R_1 < R_2$" is satisfied.

Further, in order to reduce the average reflectance in the state illustrated in FIG. 5 as compared with the case where the thin film I is not provided, it suffices that "$R_1 > R_2$" is satisfied.

The condition for the refractive index n of the thin film I is derived based on these relations.

When the condition for the refractive index n is derived based on the conditional expression "$R_1 < R_2$" for increasing the average reflectance, the condition becomes "$n > n_0$ and $n > n_m$" or "$n < n_0$ and $n < n_m$".

When the condition for the refractive index n is derived based on the conditional expression "$R_1 > R_2$" for reducing the average reflectance, the condition becomes "$n_0 < n < n_m$" or "$n_m < n < n_0$".

Particularly, as a special case of the condition for reducing the average reflectance, if "$R_1 > R_2 = 0$" is assumed, a case where the refractive index n is equal to a geometric mean of the refractive index $n_0$ and the refractive index $n_m$ as in the formula 9 is derived.

Further, since it can be said that $R_2$ characterizes the value of the average reflectance, a condition for the thickness d of the thin film I is also derived.

When the intensity reflectance R takes a value of $R_2$, the formula 11 is derived since "$\cos(2\delta)=-1$" is established. When it is assumed that the wavelength region for defining the average reflectance is "$\lambda_{min} \leq \lambda \leq \lambda_{max}$", by using the formula 11, it is indicated that the thickness d is within a range indicated by the following formula 14.

$$\frac{1}{4n}\lambda_{min} \leq d \leq \frac{2m+1}{4n}\lambda_{max} \quad \text{[Formula 14]}$$

Since m is an integer equal to or larger than 0, it appears that the formula 14 does not define an upper limit of the thickness d. However, when a large value is taken more than necessary for a value of m, the number of times in which the intensity reflectance R oscillates between $R_1$ and $R_2$ increases in the range of the wavelength region of "$\lambda_{min} \leq \lambda \leq \lambda_{max}$". Therefore, the average reflectance approaches $R_1$ to reduce the effect by the thin film I. Accordingly, in the actual design of the thin film I such as the reflection control layer 21, the value of m is selected so that the practical thickness of the thin film I is included in the range of the thickness d defined by the formula 14, within the practical range of the refractive index. By selecting a maximum value of m allowable within the practical range of the refractive index, the formula 14 provides an upper limit of the thickness d based on the value of m.

As a substance usable as a material of the thin film I, various substances are assumed. As a material having a small refractive index, silver (the refractive index in 563 nanometers is 0.12) is mentioned. Further, as a material having a large refractive index, germanium (the refractive index in 590 nanometers is 5.75) is mentioned.

In the examination described above, it is assumed that the refractive index does not depend on the wavelength, and a case of vertical incidence is assumed. However, the above results of the examination can be applied quantitatively to a case where the refractive index depends on the wavelength and a case of not being vertical incidence.

[Conditions Required for Reflection Control Layer]

In order to heat the mainstream 2, it is desired to increase the reflection intensity of light in the wavelength region (0.75 micrometer to 100 micrometers) absorbed by the sunlight absorbing substance. The light in the wavelength region from 0.75 micrometer to 100 micrometers is generated by the wavelength control substance 22 that absorbs light in the wavelength region from 0.3 micrometer to 0.75 micrometer. Therefore, it is desired to increase the intensity of light in the wavelength region from 0.3 micrometer to 0.75 micrometer that is absorbed by the wavelength control substance 22. That is, by decreasing the average reflectance of light in the wavelength region from 0.3 micrometer to 0.75 micrometer in the reflection control layer 21, the wavelength control substance 22 can absorb light in the wavelength region from 0.3 micrometer to 0.75 micrometer efficiently.

According to the present embodiment, in order to absorb light in the wavelength region from 0.3 micrometer to 0.75 micrometer incident to the surface of the automobile 1, the reflection control layer 21 is formed so that the average reflectance of the reflection control layer 21 with respect to the light in the wavelength region from 0.3 micrometer to 0.75 micrometer becomes low. Conditions for the reflection control layer 21 not to reflect light in the wavelength region from 0.3 micrometer to 0.75 micrometer are examined below.

In the present embodiment, the reflection control layer 21, the air, and the vehicle-body paint layer 20 (body-side substance) under the reflection control layer 21 respectively correspond to the thin film I, the medium M1, and the medium M2 illustrated in FIG. 8.

In order to reduce the average reflectance of the reflection control layer 21 in the wavelength region from 0.3 micrometer to 0.75 micrometer as compared with a case where the reflection control layer 21 is not provided, it suffices that the conditional expression "$R_1 > R_2$" is satisfied. Therefore, based on the examination described above, it suffices that the reflection control layer 21 is formed of a material having a refractive index smaller than the refractive index of the vehicle-body paint layer 20 and larger than the refractive index of the air in the wavelength region from 0.3 micrometer to 0.75 micrometer. Alternatively, it suffices that the reflection control layer 21 is formed of a material having a refractive index smaller than the refractive index of the air and larger than the refractive index of the vehicle-body paint layer 20 in the wavelength region from 0.3 micrometer to 0.75 micrometer.

That is, the refractive index of the reflection control layer 21 has a value inside a range between the refractive index of the vehicle-body paint layer 20 and the refractive index of the air in the wavelength region from 0.3 micrometer to 0.75 micrometer.

Alternatively, as illustrated in the formula 9, the refractive index (n) of the reflection control layer 21 may be equal to the geometric mean of the refractive index ($n_0$) of the air and the refractive index ($n_m$) of the vehicle-body paint layer 20.

When the reflection control layer 21 is to be formed on the surface of the automobile 1, it is desired that the thickness range of the reflection control layer 21 is about "20 micrometers to 40 micrometers", in view of easiness of manufacturing and quality assurance.

In the formula 14, when it is assumed that "$\lambda_{min}=0.3$ micrometer" and "$\lambda_{max}=0.75$ micrometer" are established, and the maximum m at which the formula 14 includes the thickness range of "20 micrometers to 40 micrometers" in the range of the practical refractive index n ($0.12 \leq n \leq 5.75$) is to be obtained, "m=613" is obtained.

Therefore, it is desired that the thickness of the reflection control layer 21 is equal to or larger than a value obtained by dividing 75 nanometers by the refractive index n of the reflection control layer 21, and equal to or smaller than a value obtained by dividing 230100 nanometers by the refractive index n of the reflection control layer 21.

The numerical value "230100 nanometers" should be originally "750 nanometers×(613×2+1)/4=230062.5 nanometers". However, since a significant figure of data of the refractive index is four digits, the value is rounded up to the nearest 100.

[Effects Obtained by Providing Reflection Control Layer 21]

The absorption band of the substance that absorbs sunlight included in the air is equal to or longer than 0.75 micrometer. The reflection control layer 21 formed on the surface of the automobile 1 has characteristics of absorbing light of a wavelength from 0.3 micrometer to less than 0.75 micrometer, of the incident sunlight, and emitting light of a wavelength from 0.75 micrometer to 100 micrometers. Light having a wavelength from 0.75 micrometer to 100 micrometers is emitted from the surface of the automobile 1 as reflected light. Therefore, as compared with the case where the reflection control layer 21 is not provided, the reflection intensity of light in the absorption band of the substance that absorbs sunlight in the atmosphere (the sunlight absorbing substance), of the reflection intensity of sunlight on the surface of the automobile 1, can be increased. Therefore, emission of heat (also referred to as "radiation") from the surface of the automobile 1 to the atmosphere is increased, thereby enabling to increase the temperature in the mainstream 2 that is not in contact with the surface of the automobile 1. Due to the temperature increase of the mainstream 2, the density of the air in the mainstream 2 decreases, thereby enabling to reduce the air resistance of the automobile 1.

The temperature in the mainstream 2 around the automobile 1 can be increased, while suppressing a temperature increase in the boundary layer 41 near the surface of the automobile 1, by heating the air in the mainstream 2 around the automobile 1 not by heat conduction but by the emission of heat from the surface of the automobile 1. By suppressing the temperature increase in the boundary layer 41, the increase in viscous resistance of the air in the boundary layer 41 can be suppressed, thereby enabling to reduce the air resistance of the automobile 1.

According to the present embodiment, as illustrated in FIG. 1, the reflection control layer 21 has the wavelength control substance 22 that absorbs light in the wavelength region from 0.3 micrometer to 0.75 micrometer of incident sunlight, and emits light in the wavelength region from 0.75 micrometer to 100 micrometers. The wavelength control substance 22 can absorb light in the wavelength region from 0.3 micrometer to 0.75 micrometer reflected in the boundary between the reflection control layer 21 and an underlayer thereof (the vehicle-body paint layer 20) as excitation light. Accordingly, the reflection control layer 21 can increase the reflection intensity of light in the absorption band of the sunlight absorbing substance.

The wavelength control substance 22 is a fluorescent substance. The wavelength control substance 22 can convert light in the wavelength region from 0.3 micrometer to 0.75 micrometer to light in the wavelength region from 0.75 micrometer to 100 micrometers by fluorescence.

The wavelength control substance 22 may be a phosphorescent substance. The wavelength control substance 22 can convert light in the wavelength region from 0.3 micrometer to 0.75 micrometer to light in the wavelength region from 0.75 micrometer to 100 micrometers by phosphorescence.

In the wavelength region from 0.3 micrometer to 0.75 micrometer, the thickness of the reflection control layer 21 is equal to or larger than a value obtained by dividing 75 nanometers by the refractive index of the reflection control layer 21, and equal to or smaller than a value obtained by dividing 230100 nanometers by the refractive index of the reflection control layer 21. Further, when it is assumed that the refractive index of the reflection control layer 21 is n, the refractive index of the body-side substance under the reflection control layer 21 is $n_m$, and the refractive index of the air is $n_0$, n satisfies the formula 9 in the wavelength region from 0.3 micrometer to 0.75 micrometer. Accordingly, the average reflection intensity of light in the wavelength region from 0.3 micrometer to 0.75 micrometer is reduced, and much more light can be used as the excitation light. Therefore, the reflection intensity of light in the absorption band of the sunlight absorbing substance can be increased.

The refractive index of the reflection control layer 21 is from 0.34 to 2.40. Accordingly, the average reflection intensity of light in the wavelength region from 0.3 micrometer to 0.75 micrometer is reduced, and much more light can be used as the excitation light. Therefore, the reflection intensity of light in the absorption band of the sunlight absorbing substance can be increased.

Second Embodiment

Figure 3:
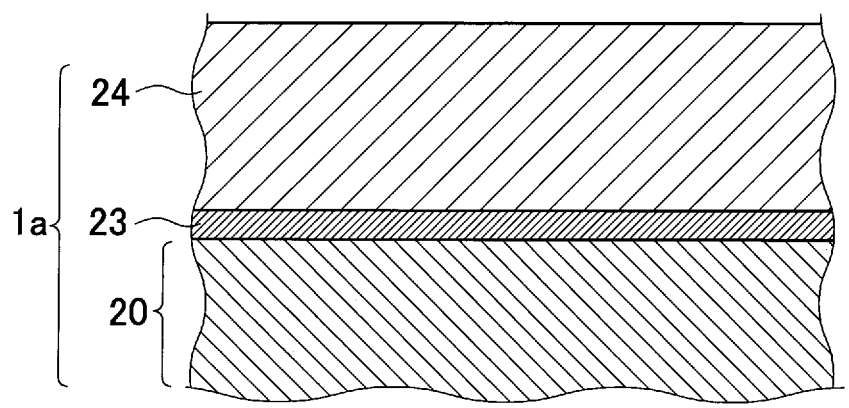
FIG. 3 is an enlarged sectional view illustrating a surface structure of an automobile 1 according to a second embodiment.

As illustrated in FIG. 3, the vehicle-body paint layer 20 is formed on a surface of the vehicle body 1a of the automobile 1 and a wavelength control layer 23 is formed on the vehicle-body paint layer 20. A reflection prevention layer 24 is formed on the wavelength control layer 23. The reflection control layer 21 according to a second embodiment is different from that of the first embodiment in that the reflection control layer 21 includes the reflection prevention layer 24 and the wavelength control layer 23. Other configurations, operations, and effects that are not described in the second embodiment are substantially identical to those of the first embodiment and thus redundant explanations thereof are omitted.

The reflection control layer 21 includes the reflection prevention layer 24, and the wavelength control layer 23 formed between the reflection prevention layer 24 and the vehicle-body paint layer 20. The reflection control layer 21 has a multilayer structure of the wavelength control layer 23 and the reflection prevention layer 24.

The wavelength control layer 23 absorbs the light 11 in the wavelength region from 0.3 micrometer to 0.75 micrometer of the incident sunlight, and emits the light 12 in the wavelength region from 0.75 micrometer to 100 micrometers, as in the wavelength control substance 22 of the first embodiment. The wavelength control substance 22 of the first embodiment is a granular body; however, the wavelength control layer 23 has a membrane structure.

[Conditions Required for Reflection Prevention Layer]

Conditions for the reflection prevention layer 24 to prevent reflection of light in the wavelength region from 0.3 micrometer to 0.75 micrometer are examined below.

In the present embodiment, the reflection prevention layer 24, the air, and the wavelength control layer 23 respectively correspond to the thin film I, the medium M1, and the medium M2 illustrated in FIG. 8.

In order to reduce the average reflectance of the reflection prevention layer 24 in the wavelength region from 0.3 micrometer to 0.75 micrometer as compared with a case where the reflection prevention layer 24 is not provided, it suffices that the conditional expression "$R_1 > R_2$" is satisfied. Therefore, based on the examination described above, it suffices that the reflection prevention layer 24 is formed of a material having a refractive index in a range between the refractive index of the wavelength control layer 23 and the refractive index of the air in the wavelength region from 0.3 micrometer to 0.75 micrometer.

In order to further reduce the average reflectance of the reflection prevention layer 24, it suffices that the conditional expression "$R_1 > R_2 = 0$" is satisfied and that the refractive index of the reflection prevention layer 24 is equal to the geometric mean of the refractive index of the wavelength control layer 23 and the refractive index of the air.

When the reflection prevention layer 24 is to be formed on the surface of the automobile 1, it is desired that the thickness range of the reflection prevention layer 24 is about "20 micrometers to 40 micrometers", in view of easiness of manufacturing and quality assurance.

In the formula 14, when it is assumed that "$\lambda_{min} = 0.3$ micrometer" and "$\lambda_{max} = 0.75$ micrometer" are established, and the maximum m at which the formula 14 includes the thickness range of "20 micrometer to 40 micrometer" in the range of the practical refractive index n (0.12≤n≤5.75) is to be obtained, "m=613" is obtained.

Therefore, it is desired that the thickness of the reflection prevention layer 24 is equal to or larger than a value obtained by dividing 75 nanometers by the refractive index n of the reflection prevention layer 24, and equal to or smaller than a value obtained by dividing 230100 nanometers by the refractive index n of the reflection prevention layer 24.

It is desired that the refractive index of the reflection prevention layer 24 is from 0.34 to 2.40 inclusive in the wavelength region from 0.3 micrometer to 0.75 micrometer, taking into consideration that the reflection prevention layer 24 is in the range of the practical refractive index n (0.12≤n≤5.75) and the refractive index of the air is about 1.

Further, in order to prevent that the reflection prevention layer 24 prohibits the function of the wavelength control layer 23, it is preferable that an effect of the reflection prevention layer 24 to prevent reflection of light in the wavelength region from 0.75 micrometer to 100 micrometers is small. In order to achieve this prevention, it suffices that the reflection prevention layer 24 is formed of a material having a refractive index equal to both the refractive index of the wavelength control layer 23 and the refractive index of the air, or larger than those in the wavelength region from 0.75 micrometer to 100 micrometers. Alternatively, it suffices that the reflection prevention layer 24 is formed of a material having a refractive index equal to both the refractive index of the wavelength control layer 23 and the refractive index of the air, or smaller than those in the wavelength region from 0.75 micrometer to 100 micrometers.

[Effects of Providing Wavelength Control Layer 23 and Reflection Prevention Layer 24]

According to the present embodiment, as illustrated in FIG. 3, the reflection control layer 21 has the wavelength control layer 23 that absorbs light in the wavelength region from 0.3 micrometer to 0.75 micrometer of incident sunlight and emits light in the wavelength region from 0.75 micrometer to 100 micrometers. The wavelength control layer 23 can absorb light in the wavelength region from 0.3 micrometer to 0.75 micrometer that transmits the reflection prevention layer 24 as the excitation light. Therefore, the reflection prevention layer 24 reduces the surface reflection of light in the wavelength region from 0.3 micrometer to 0.75 micrometer. The reflection intensity of light in the absorption band of the sunlight absorbing substance can be increased.

The wavelength control layer 23 includes a fluorescent substance. Due to the fluorescence, light in wavelength region from 0.3 micrometer to 0.75 micrometer can be converted to light in the wavelength region from 0.75 micrometer to 100 micrometers.

The wavelength control layer 23 may include a phosphorescent substance. Due to the phosphorescence, light in wavelength region from 0.3 micrometer to 0.75 micrometer can be converted to light in the wavelength region from 0.75 micrometer to 100 micrometers.

In the wavelength region from 0.3 micrometer to 0.75 micrometer, the thickness of the reflection prevention layer 24 is equal to or larger than a value obtained by dividing 75 nanometers by the refractive index of the reflection prevention layer 24, and equal to or smaller than a value obtained by dividing 230100 nanometers by the refractive index of the reflection prevention layer 24. Further, when it is assumed that the refractive index of the reflection prevention layer 24 is n, the refractive index of the underlayer (the wavelength control layer 23) being in contact with a surface-side boundary face of the reflection prevention layer 24 is $n_m$, and the refractive index of the air is $n_0$, n satisfies the formula 9 in the wavelength region from 0.3 micrometer to 0.75 micrometer. Accordingly, the average reflection intensity of light in the wavelength region from 0.3 micrometer to 0.75 micrometer is reduced, and much more light can be used as the excitation light. Therefore, the reflection intensity of light in the absorption band of the sunlight absorbing substance can be increased.

The refractive index of the reflection prevention layer 24 is from 0.34 to 2.40. Accordingly, the average reflection intensity of light in the wavelength region from 0.3 micrometer to 0.75 micrometer is reduced, and much more light can be used as the excitation light. Therefore, the reflection intensity of light in the absorption band of the sunlight absorbing substance can be increased.

Figure 4:
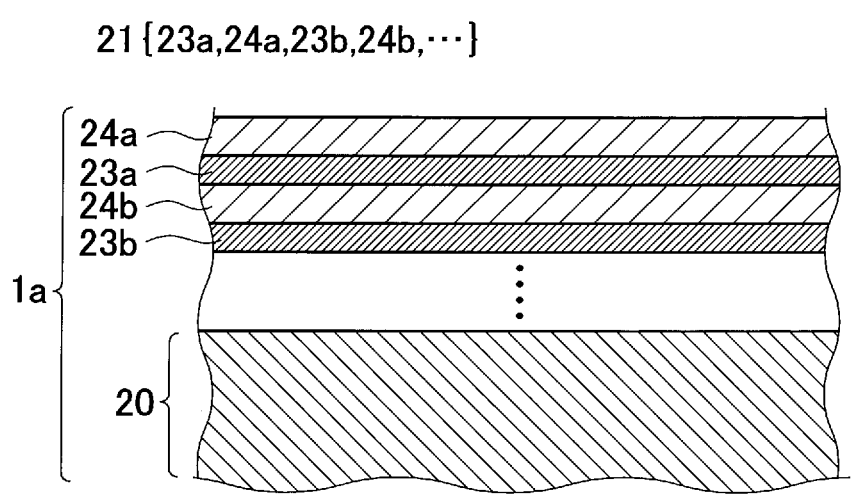
FIG. 4 is an enlarged sectional view illustrating a surface structure of an automobile 1 according to a modification of the second embodiment.

As illustrated in FIG. 4, the reflection control layer 21 according to the second embodiment may be formed by repeatedly laminating a plurality of layers of the wavelength control layers 23a, 23b, . . . and the reflection prevention layers 24a, 24b, . . . . Accordingly, the wavelength control effect by the wavelength control layer 23 and the reflection prevention effect by the reflection prevention layer 24 increase.

In the respective embodiments described above, a case where the mobile body is the automobile 1 has been described. However, the present invention can be applied to a mobile body that moves in the air, other than the automobile 1. As an example of the mobile body, a two-wheeled vehicle, railway train, aircraft, rocket, and the like can be mentioned other than an automobile.

Although the contents of the present invention have been described above with reference to the embodiments, the present invention is not limited to these descriptions, and it will be apparent to those skilled in the art that various modifications and improvements can be made. It should not be construed that the present invention is limited to the descriptions and the drawings that constitute a part of the present disclosure. On the basis of the present disclosure, various alternative embodiments, practical examples, and operating techniques will be apparent to those skilled in the art.

In is needless to mention that the present invention also includes various embodiments that are not described herein. Therefore, the technical scope of the present invention is to be defined only by the invention specifying matters according to the scope of claims appropriately obtained from the above descriptions.

REFERENCE SIGNS LIST 1 automobile (mobile body)
21 reflection control layer
22 wavelength control substance
23 wavelength control layer
24 reflection prevention layer
$n_m$ refractive index of body-side substance under reflection control layer or reflection prevention layer
n refractive index of reflection control layer or reflection prevention layer
$n_0$ refractive index of air

The invention claimed is:

1. A mobile body comprising a reflection control layer that is formed on a surface of the mobile body,
wherein the reflection control layer includes:

a reflection prevention layer that reduces surface reflection of light in a wavelength region from 0.3 micrometer to 0.75 micrometer, and a wavelength control layer that is formed between the reflection prevention layer and a surface of the mobile body, to absorb light in a wavelength region from 0.3 micrometer to 0.75 micrometer of incident sunlight, and emit light in a wavelength region from 0.75 micrometer to 100 micrometers.

2. The mobile body according to claim 1, wherein the wavelength control layer has a wavelength control substance that absorbs light in a wavelength region from 0.3 micrometer to 0.75 micrometer of incident sunlight, and emits light in a wavelength region from 0.75 micrometer to 100 micrometers.

3. The mobile body according to claim 2, wherein the wavelength control substance is a fluorescent substance.

4. The mobile body according to claim 1, wherein the wavelength control layer includes a fluorescent substance.

5. The mobile body according to claim 2, wherein the wavelength control substance is a phosphorescent substance.

6. The mobile body according to claim 1, wherein the wavelength control layer includes a phosphorescent substance.

7. The mobile body according to claim 2, wherein in a wavelength region from 0.3 micrometer to 0.75 micrometer, a thickness of the reflection control layer is equal to or larger than a value obtained by dividing 75 nanometers by a refractive index of the reflection control layer, and equal to or smaller than a value obtained by dividing 230100 nanometers by a refractive index of the reflection control layer, and when it is assumed that a refractive index of the reflection control layer is n, a refractive index of a body-side substance under the reflection control layer is $n_m$, and a refractive index of air is no, in a wavelength region from 0.3 micrometer to 0.75 micrometer, the n satisfies a following formula $$n=(n_m \times n_0)^{1/2}.$$

8. The mobile body according to claim 1, wherein in a wavelength region from 0.3 micrometer to 0.75 micrometer, a thickness of the reflection prevention layer is equal to or larger than a value obtained by dividing 75 nanometers by a refractive index of the reflection prevention layer, and equal to or smaller than a value obtained by dividing 230100 nanometers by a refractive index of the reflection prevention layer, and when it is assumed that a refractive index of the reflection prevention layer is n, a refractive index of a body-side substance under the reflection prevention layer is $n_m$, and a refractive index of air is no, in a wavelength region from 0.3 micrometer to 0.75 micrometer, the n satisfies a following formula $$n=(n_m \times n_0)^{1/2}.$$

9. The mobile body according to claim 7, wherein a refractive index of the reflection control layer is from 0.34 to 2.40.

10. The mobile body according to claim 8, wherein a refractive index of the reflection prevention layer is from 0.34 to 2.40.

* * * * *